United States Patent [19]

Enderby et al.

[11] Patent Number: 4,713,631
[45] Date of Patent: Dec. 15, 1987

[54] VARACTOR TUNING CIRCUIT HAVING PLURAL SELECTABLE BIAS VOLTAGES

[75] Inventors: Ralph T. Enderby, Sunrise; Enrique Ferrer, Miami; Wayne P. Shepherd, Sunrise, all of Fla.

[73] Assignee: Motorola Inc., Schaumburg, Ill.

[21] Appl. No.: 816,589

[22] Filed: Jan. 6, 1986

[51] Int. Cl.$^4$ .......................... H03B 5/08; H03H 5/12; H03L 7/18
[52] U.S. Cl. .............................. 331/36 C; 331/177 V; 334/15; 455/183; 455/186; 455/195
[58] Field of Search ............. 331/36 C, 177 V, 117 R, 331/117 FE; 332/30 V; 334/15; 307/320; 455/180–186, 192–199, 260, 262; 375/120

[56] References Cited

U.S. PATENT DOCUMENTS

| | | | |
|---|---|---|---|
| 3,135,934 | 6/1964 | Schoenike | 333/81 R |
| 3,260,959 | 7/1966 | Broadhead, Jr. | 331/36 C X |
| 3,443,205 | 5/1969 | Ludwig et al. | 323/229 |
| 3,488,605 | 1/1970 | Schwartz | 331/36 C X |
| 3,492,514 | 1/1970 | Korn | 307/320 |
| 3,559,075 | 1/1971 | Okazaki | 455/180 |
| 3,579,281 | 5/1971 | Kam et al. | 331/36 C X |
| 3,581,240 | 5/1971 | Enderby | 332/26 |
| 3,611,154 | 10/1971 | Kupfer | 455/180 |
| 3,866,138 | 2/1975 | Putzer | 331/60 |
| 4,254,504 | 3/1981 | Lewis et al. | 455/76 |
| 4,370,629 | 1/1983 | Martin | 331/177 V X |
| 4,511,858 | 4/1985 | Charavit et al. | 331/10 |

FOREIGN PATENT DOCUMENTS 1234278 2/1967 Fed. Rep. of Germany ........ 334/15

*Primary Examiner*—Siegfried H. Grimm
*Attorney, Agent, or Firm*—Daniel K. Nichols; Joseph T. Downey; Mark P. Kahler

[57] ABSTRACT

A variable capacitance circuit includes a varactor having an anode side and a cathode side. A first variable bias voltage is applied to one of the sides and one of a plurality of voltages is applied as a second bias voltage to the other side for controlling the capacitance of the varactor. A voltage multiplier circuit connected to a voltage divider network is used for supplying the plurality of voltages. A decoder is responsive to input signals for selecting and applying one of the multiple voltage outputs. The variable capacitance circuit is used in a voltage controlled oscillator of a frequency synthesizer for providing extended frequency range.

7 Claims, 6 Drawing Figures

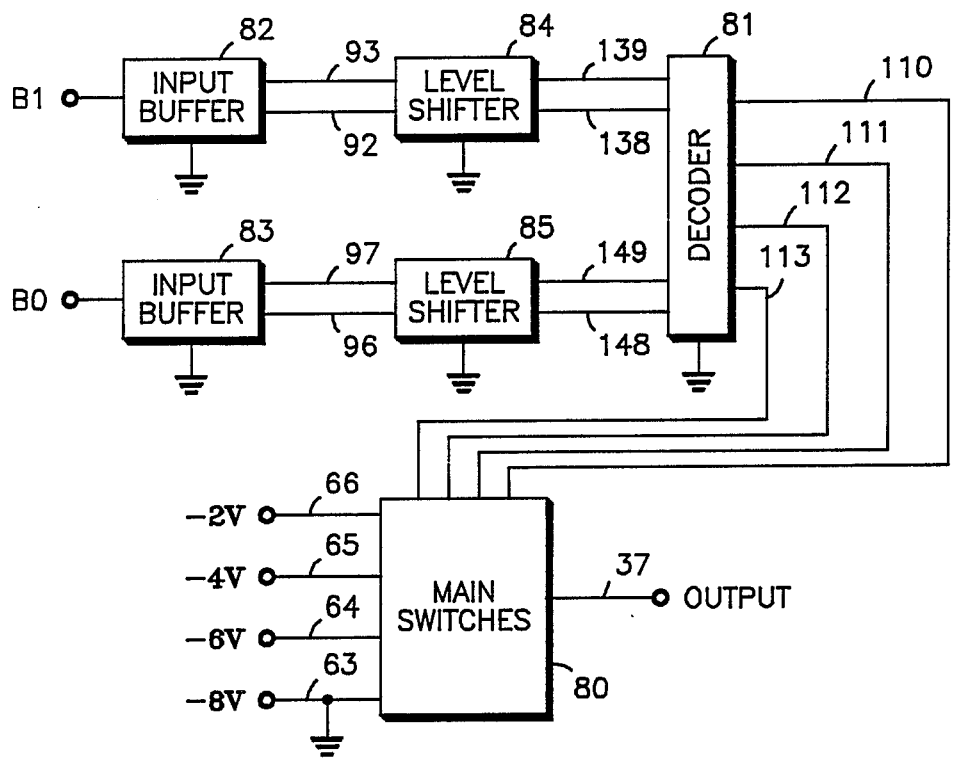
*FIG. 4*
*FIG. 5*
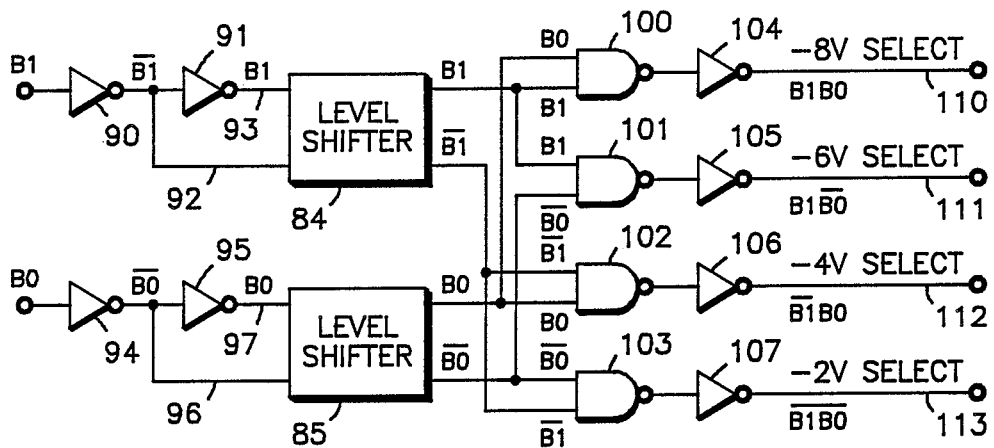

ic circuits in general and, in particular, to the use of such circuits in tuned resonant circuits such as voltage controlled oscillators (VCO's) with a programmable bias voltage.

VARACTOR TUNING CIRCUIT HAVING PLURAL SELECTABLE BIAS VOLTAGES

BACKGROUND OF THE INVENTION

This invention relates to variable capacitance circuits in general and, in particular, to the use of such circuits in tuned resonant circuits such as voltage controlled oscillators (VCO's) with a programmable bias voltage.

Varactors are typically utilized in voltage controlled oscillator circuits. A varactor is essentially a reversed biased diode that exhibits a capacitance dependent upon the magnitude of the reverse bias voltage applied to it. When used in a resonant circuit, such as an oscillator, the frequency of resonance can be controlled by controlling the bias voltage applied across the varactor.

A typical application of VCO's are in frequency synthesizer circuits such as phase lock loops (PLL). In a PLL circuit, a voltage output of a phase detector is applied via a loop amplifier to the varactor of the VCO in order to control the VCO frequency. For example, the positive voltage applied to the varactor can be derived from the phase detector and loop amplifier while the low or negative side of the varactor is tied to ground or referenced to another fixed bias point. These polarities can be reversed if desired and the varactor's high side can be tied to a fixed bias point while the varactor's low side is tied to the loop amplifier.

When it is desired to provide a substantial range of frequency output of the VCO, the available control voltage applied to the VCO must vary sufficiently to allow the necessary change in capacitance of the varactor and consequently the VCO frequency. A significant problem arises when the available voltage range applied to the phase comparator is less than the required voltage range to change the capacitance of the varactor.

For example, a phase detector and loop amplifier operating on a five volt power supply may have an effective output range from 0.5 to 4 volts. This will allow only a variation of 3.5 volts in the voltage appearing across the varactor. While it is possible to increase the operating voltage applied to the phase detector and loop amplifier, this may be undesirable for a number of reasons.

In a portable radio device or the like, the circuit operating voltage is derived from batteries having a predetermined output. The voltage available to apply to the phase comparator, loop amplifier and varactor may be less than the battery voltage due to voltage drops across voltage regulators and the like.

While a DC to DC converter could be used to provide a step up operating voltage to the phase comparator and loop amplifier, such a circuit would introduce inefficiency in the operation of the device, as the phase comparator and loop amplifier would necessarily draw additional current and consequently consume more power than the circuits would when operated at a lower voltage.

In applications such as portable radios, conservation of battery energy is of upmost importance. Consequently, in applying increased operating bias voltage to the varactor circuit, it is desirable that increased voltages not be applied to other circuits that would increase battery current drain of the device. Such increased voltages might also be too high for the particular circuit (i.e. a low voltage circuit such as some CMOS IC processors).

SUMMARY OF THE INVENTION

This variable capacitance circuit includes means for applying and increasing voltage potential to a varactor without applying an increased operating voltage to other circuits.

The variable capacitance circuit includes a varactor having an anode side and a cathode side. A first voltage bias means applies a variable voltage to the varactor and a second voltage bias means selectively applies one of a plurality of voltages to the varactor. The first and second bias means cooperatively control the capacitance of the varactor.

In one aspect of the invention, the first voltage bias means is connected to one of said sides of the varactor and the second voltage bias means is connected to the other of said sides of the varactor. In still another aspect of the invention, the first and second bias means supply voltages having opposite polarities.

In one aspect of the invention, the second voltage bias means includes a voltage multiplier that has an output and a voltage divider network is connected to the output of the voltage multiplier circuit for supplying the plurality of voltages. The second voltage bias means includes a plurality of switch means connected to the divider network. Each switch means is selectively individually actuated for supplying one of the output voltages to the varactor.

In another aspect of the invention, decoder means are operatively connected to the switch means for actuating the switch means. Input means supply digital signals to the decoder means and the decoder means selectively actuates one of the switch means in response to the digital signals. In still another aspect of the invention, the switch means are field effect transistors and the input means includes level shifting means providing voltage levels to the decoder means capable of switching the transistors.

In yet another aspect of the invention, a voltage controlled oscillator circuit includes a varactor, a first varactor bias means applies a variable voltage to one of the sides of the varactor and a second varactor bias means selectively applies one of a plurality of voltages to the other side of the varactor. The second varactor bias means includes input means for receiving input signals and switching means for selectively switching said one of said plurality of voltages to the varactor dependent on said input signals. Level shifting means are included for shifting the voltage level of the input signals for actuating the switching means.

In still another aspect of the invention, a frequency synthesizer circuit includes a voltage controlled oscillator which is biased by a loop amplifier and by a voltage generator circuit that supplies one of a plurality of voltages to the voltage controlled oscillator for controlling the output frequency of the voltage controlled oscillator.

In another aspect of the invention, a radio having a frequency synthesizer, and a memory means that includes channel information with divisor information for the frequency synthesizer comprises a voltage controlled oscillator having a varactor biased by the frequency synthesizer and bias means selectively supplying one of a plurality of voltages to the varactor for affecting the frequency of the voltage controlled oscillator. The bias means is operatively actuated by the memory means by providing one of the plurality of voltages to the varactor. The memory means includes data for each channel corresponding to one of the plurality of voltages for actuating the bias means.

BRIEF DESCRIPTION OF THE DRAWINGS

FIG. 4 is a block diagram of the multiplexer circuit of FIG. 2.

FIG. 5 is a logic diagram of the multiplexer circuit of FIG. 2.

DESCRIPTION OF THE PREFERRED EMBODIMENT

Figure 1:
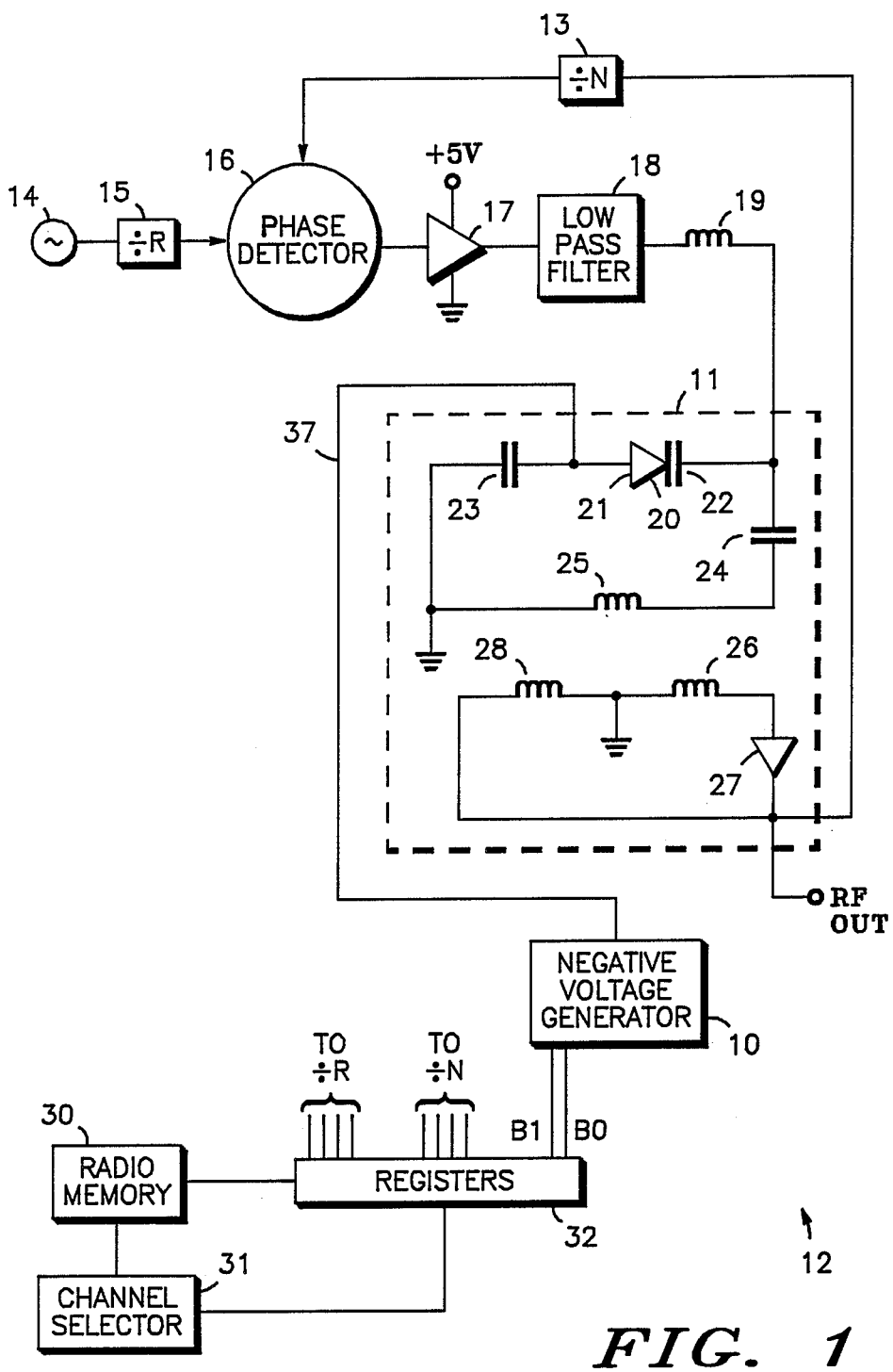
FIG. 1 is a block diagram of a frequency synthesizer circuit of a radio utilizing a variable capacitance circuit.

Referring now by characters of reference to the drawings the first to FIG. 1, it will be understood that the negative voltage generator 10 can be utilized with voltage controlled oscillator (VCO) 11 of a frequency synthesizer circuit indicated generally by 12.

The frequency synthesizer 12 includes the VCO 11, a programmable divider 13, designated as "divide by N", and a reference frequency oscillator 14 connected to a programmable divider 15, designated as "divide by R". Programmable dividers 13 and 15 are connected to a phase detector 16 which has its output connected to a loop amplifier 17, the output of which goes through low pass filter 18 and RF choke 19 before being applied to VCO 11 as a first DC bias voltage. The phase detector 16 and loop amplifier 17 constitute a first DC bias means.

The VCO 11 includes a varactor 20 having an anode 21 which is connected to a bypass capacitor 23 and to the negative voltage generator 10 which constitutes a second DC bias means. The varactor 20 has its cathode 22 operatively connected to the output of loop amplifier 17 and is also serially connected through capacitor 24 and coil 25 to ground to provide a tuned resonant circuit. Coil 26 is coupled to coil 25 and is connected between ground and the input of an amplifier 27. Coil 28 is connected between the output of the amplifier 27 and ground and is coupled to the coils 25 and 26.

A radio memory 30, constituting memory means, which can be a PROM or the like, is used to store channel frequency information such as divide by R and divide by N information for application to the frequency synthesizer 12 in a conventional manner. A channel selector designated as 31 is used for interfacing with the radio memory 30 to cause the appropriate channel information to be loaded into registers 32 in a conventional manner.

In addition to the divide by R and divide by N information, the radio memory includes additional bits of information for each channel frequency which are designated as B1 and B0. Bits B1 and B0 are also loaded into the registers 32 with the other channel information and the B1 and B0 bits are applied to the negative voltage generator 10.

Figure 2:
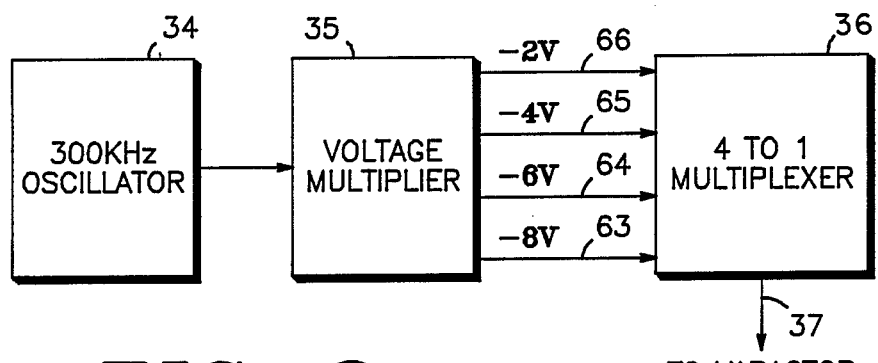
FIG. 2 is a block diagram of the negative voltage generator of FIG. 1.

The negative voltage generator 10 is shown in FIG. 2. An oscillator circuit 34, which in the preferred embodiment is a 300 KHz oscillator, provides the clock signal that is applied to a voltage multiplier 35. Voltage multiplier 35 has a plurality of output voltages that are applied to a multiplexer circuit 36. The multiplexer circuit 36 is used to select one of the voltages from the voltage multiplier 35 and it is supplied on line 37 to the varactor 20.

Figure 3:
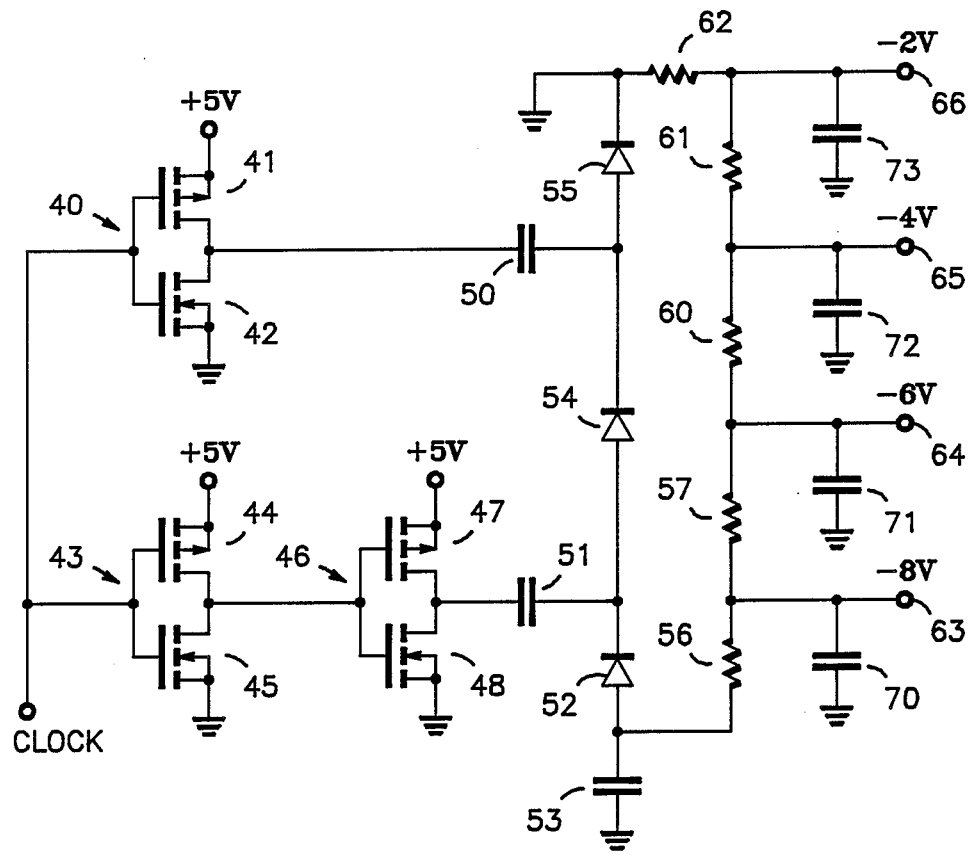
FIG. 3 is a electrical schematic diagram of the voltage multiplier circuit of FIG. 2.

Referring now to FIG. 3, a detailed electrical schematic diagram of the voltage multiplier 35 is shown. The 300 KHz signal from the oscillator 34 is applied at the clock input which is connected to the input of a inverter 40 formed by P-channel mosfet 41 and N-channel mosfet 42. The clock signal is also applied to the input of an inverter 43 formed by P-channel mosfet 44 and N-channel mosfet 45. The output of the inverter 43 is applied to inverter 46 formed by P-channel mosfet 47 and N-channel mosfet 48. It will be appreciated that the outputs of inverters 40 and 46 are 180 degrees out of phase or opposite When the clock signal is low, mosfet 41 turns on and charges capacitor 50 to approximately 4.6 volts. At the same time, the output of inverter 46 goes low as mosfet 48 is turned on causing capacitor 51, which on previous cycles has been charged to approximately −9.2 volts, to discharge through diode 52 and charge capacitor 53 to approximately −8.8 volts. During the next half cycle, mosfet 42 turns on and capacitor 50 discharges through diode 54 charging capacitor 51. During this half cycle, diodes 55 and 52 are reverse biased.

The output voltage appearing on capacitor 53 under typical operating conditions is −8.673 volts. Resistors 56, 57, 60, 61, and 62 are serially connected from capacitor 53 to ground in order to provide a resistor voltage divider network. The values of resistors 56, 57, 60, 61, and 62 are chosen to give the desired output voltages.

In the preferred embodiment, resistor 56 has a value of 37.2 K Ohms while resistors 57, 60, 61, and 62 each have a value of 110.7 K Ohms. These values are chosen to give output voltages of −8, −6, −4, and −2 volts at outputs 63 through 66 respectively. Filter capacitors 70 through 73 are provided for filtering purposes at the output lines 63 through 66 respectively.

Referring now to FIG. 4, a block diagram of the multiplexer 36 is shown. The output voltages on lines 63 through 66 are applied to main switches 80 constituting switching means which is controlled by a output of a decoder 81. The two bits of digital information, designated as B1 and B0, are provided through input buffers 82 and 83, level shifter circuits 84 and 85 to the decoder 81, constituting decoder means, for controlling the output of the main switches 80. The particular circuit of the preferred embodiment is disclosed in FIG. 6, while a logic diagram is shown in FIG. 5.

Referring first to FIG. 5, input buffer 82 is provided by a pair of inverters 90 and 91. The B1 input is applied to the input of inverter 90 while the inverter's output, B1 bar, is applied to both the input of inverters 91 and by line 92 to the level shifter 84. The output of inverter 91, which is a logical B1 signal, is applied by line 93 to the level shifter 84.

In a similar manner, the B0 input is applied to inverters 94 and 95 with the B0 bar signal on line 96 and the B0 signal on line 97 being applied to the level shifter 85. The B1, B1 bar, B0, and B0 bar outputs on level shifters 84 and 85 are applied in a conventional manner to the one-of-four decoder circuit 81 comprised of dual input NAND gates 100 through 103 each of which has its output connected to one of the inverters 104 through 107, respectively.

The output of inverter 104, line 110, which is the −8 volt select line, is high when B1 and B0 are both high. The output of inverter 105, line 111, which is the −6 volt select line, is high when B1 is high and B0 is low. The output of inverter 106, line 112, which is the −4 volt select line, is high when B1 is low and B0 is high and the output of inverter 107, line 113, which is the −2 volt select line, is high when B1 and B0 are both low.

Figure 6:
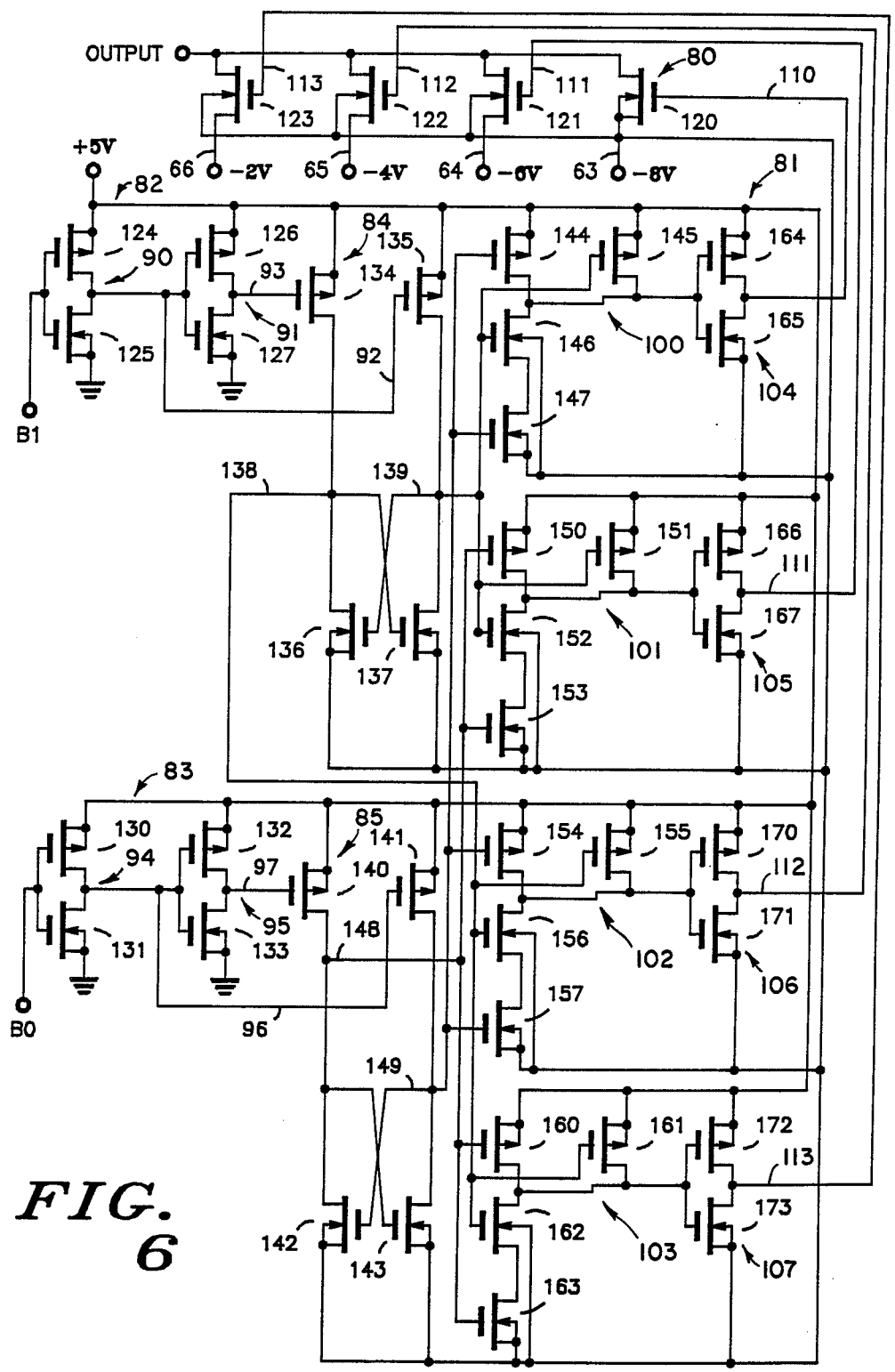
FIG. 6 is an electrical schematic diagram of the multiplexer circuit of FIG. 2.

Referring now to FIG. 6, it will be seen that the main switches 80 are provided by mosfet transistors 120 through 123, constituting switch means. The gates of transistors 120 through 123 are selectively biasd on with a +5 volt signal or off with a −8 volt signal depending upon the output of the decoder 81 on lines 110 through 113.

Inverter 90 of input buffer 82 is formed by P-channel mosfet 124 and N-channel mosfet 125 while inverter 91 is formed by P-channel mosfet 126 and N-channel mosfet 127. Similarly, inverter 94 of input buffer 83 is formed by P-channel mosfet 130 and N-channel mosfet 131 while inverter 95 is provided by P-channel mosfet 132 and N-channel mosfet 133.

Logic levels on lines 92, 93, 96 and 97 are +5 volts for a high and 0 volts for a low. These lines are applied to level shifter circuits 84 and 85 in order to change the logic levels so that the high remains represented by +5 volts while the low is now represented by −8 volts.

To accomplish the level shifting, line 93 is coupled to a P-channel mosfet 134 and line 92 is coupled to a P-channel mosfet 135. When line 92 goes low and line 93 goes high, transistor 134 is turned off and transistor 135 is turned on, which causes transistor 136 to be turned on and transistor 137 to be turned off. Under this condition, line 138 which represents B1 bar, is low and line 139, which represents B1 is high.

Conversely, when line 93 goes low and line 92 goes high, transistor 134 is turned on and transistor 135 is turned off, which causes transistor 137 to be turned on and transistor 136 to be turned off. Under this condition, line 138 is high and line 139 is low. In order to assure proper operation of the circuit, it is important that transistors 134 and 135 be capable of supplying more current than can be sunk by transistors 136 and 137.

Level shifter 85 is formed and operates in an identical manner with transistors 140, 141, 142, and 143 corresponding to transistors 134, 135, 136 and 137, respectively. Line 148 provides the B0 bar signal while line 149 provides the B0 signal to the decoder 81.

NAND gate 100 is formed by P-channel mosfets 144 and 145 along with N-channel mosfets 146 and 147 in a conventional manner. Similarly, NAND gate 101 is formed by P-channel mosfets 150 and 151 and N-channel mosfets 152 and 153. NAND gate 102 is formed by P-channel mosfets 154 and 155 and N-channel mosfets 156 and 157. NAND gate 103 is formed by P-channel mosfets 160 and 161 and N-channel 162 and 163.

Inverter 104 is provided by P-channel mosfet 164 and N-channel mosfet 165. Inverter 105 is formed by P-channel mosfet 166 and N-channel mosfet 167. P-channel mosfet 170 and N-channel mosfet 171 form inverter 106 while P-channel mosfet 172 and N-channel mosfet 173 form inverter 107.

It is thought that the advantages of the circuit have become fully apparent from the foregoing description of parts, but for completeness of disclosure a brief description of the operation and use of the circuit will be given.

The VCO circuit 11 is a representative circuit of the type utilizing a varactor in a tuned resonant circuit. It will be appreciated that other specific VCO circuits which utilize varactors can be utilized. The bias voltage and, hence, the capacitance of varactor 20, is determined both by the DC bias voltages, applied at its cathode from the loop amplifier 17 through low pass filter 18 and RF choke 19, and the DC bias voltage from the negative voltage generator 10 that is supplied to the anode 21 of the varactor.

The possible voltage range from the loop amplifier 17 may be from 0.5 to 4 volts, giving a variation of 3.5 volts. With −2 volts applied to the anode 21, the voltage across varactor 20 can vary from 2.5 to 6 volts. With −4 volts applied to the anode 21, the voltage across varactor 20 can vary between 4.5 to 8 volts. With −6 volts applied to anode 21, the voltage across varactor 20 can vary between 6.5 and 10 volts, while with −8 volts applied to anode 21, the voltage across varactor 20 can vary between 8.5 and 12 volts. Consequently, while supplying the frequency synthesizer with only a +5 volt to ground supply it is possible to obtain a range of voltages across varactor 20 from 2.5 to 12 volts or a variation of 9.5 volts.

It is only necessary to operate the level shifters 84 and 85 and decoder 81 between +5 volts and −8 volts. The remaining circuitry can be operated off the single +5 volt to ground supply, thereby conserving current drain and power usage in the device.

When the radio memory is programmed with divisor information for the divide by N and divide by R dividers 13 and 15, additional bits of information, namely B1 and B0, are programmed for each frequency in order to control the output of the negative voltage generator 10 so that the necessary voltage can appear across varactor 20 to produce the desired oscillator frequency of VCO 11. The necessary voltage offset can be readily determined for any particular varactor 20. As is apparent, overlap in the particular varactor voltage ranges has been with each step of the negative voltage generator 10.

While the preferred embodiment utilizes only four output voltages of the negative voltage generator 10, it will be appreciated that any desired number could be utilized with the use of an appropriate voltage divider networks, an appropriate number of bits of information for a decoder based on the number of desired output voltages.

For example, if three bits of information are used, up to 8 offset bias voltages can be supplied. A particularly useful voltage level to apply in some applications would be 0 volts. For purposes of this application 0 volt s is considered to be of opposite polarity to the polarity of voltage from the loop amplifier 17. If desired, the negative voltage generator 10 could be a positive voltage generator and the output of loop amplifier 17 could be a range of negative voltages with the connection of varactor 20 being reversed.

While the circuit of the preferred embodiment utilizes bits B1 and B0 that are individually stored for each desired frequency operation of the VCO 11, it will be appreciated that those bits could be derived from a look-up table that is based on the frequency or diviser information supplied to frequency synthesizer 12. Storing bits for individual channels is particularly convenient in radios and the like where additional information, such as divisors, are individually stored for each channel.

We claim as our invention:
1. A variable capacitance circuit comprising:
a varactor having an anode side and a cathode side, a first voltage bias means connected to one of said sides of the varactor for applying a variable voltage to the varactor, a second voltage bias means connected to the other of said sides of the varactor for selectively applying one of a plurality of voltages to the varactor, wherein the first and second bias means cooperatively control the capacitance of the varactor, the second voltage bias means including a voltage multiplier circuit having an output, and a voltage divider network connected to the output of the voltage multiplier circuit for supplying said plurality of voltages.

2. A variable capacitance circuit as defined in claim 1, in which:

the variable capacitance circuit is utilized in a voltage controlled oscillator circuit.

3. A variable capacitance circuit as defined in claim 1, in which;

the second voltage bias means further includes a plurality of switch means connected to the divider network, each switch means being selectively individually actuable for supplying one of said voltages to said varactor.

4. A variable capacitance circuit as defined in claim 3, in which;

decoder means are operatively connected to the switch means for actuating the switch means.

5. A variable capacitance circuit as defined in claim 4, in which;

input means supply digital signals to the decoder means and the decoder means selectively actuates one of the switch means on in response to the digital signals.

6. A variable capacitance circuit as defined in claim 3, in which;

the switch means are field effect transistors, and the input means includes level shifting means for providing voltage levels to the decoder means capable of switching the transistors.

7. A frquency synthesizer circuit comprising;

a voltage controlled oscillator having an input and an output, and including a varactor having anode and cathode sides, a programmable divider connected to the voltage controlled oscillator and having an output, a reference oscillator circuit for supplying a reference frequency signal, a phase detector means having a first input connected to the programmable divider, a second input receiving the reference frequency signal and an output operatively connected to the input of the voltage controlled oscillator for supplying a voltage to one of said sides of the varactor to control the frequency of the oscillator, and a voltage generator circuit selectively supplying one of a plurality of voltages to the other of said sides of the varactor of the voltage controlled oscillator for affecting the output frequency of the voltage controlled oscillator, the voltage generator including a voltage multiplier circuit, and a voltage divider network connected to the voltage multiplier circuit for selectively supplying said one of a plurality of voltages to the other side of the varactor.

* * * * *